United States Patent [19]
Shin et al.

[11] Patent Number: 5,436,868
[45] Date of Patent: Jul. 25, 1995

[54] WORD LINE SELECTION CIRCUIT FOR SELECTING MEMORY CELLS

[75] Inventors: Yasuhiro Shin; Hidetaka Kodama; Tatsuya Kimura, all of Tokyo, Japan

[73] Assignee: Oki Electric Industry Co., Ltd., Tokyo, Japan

[21] Appl. No.: 258,799

[22] Filed: Jun. 13, 1994

Related U.S. Application Data

[62] Division of Ser. No. 86,008, Jul. 1, 1993, abandoned.

[30] Foreign Application Priority Data

Jul. 7, 1992 [JP] Japan .................. 4-179879

[51] Int. Cl.⁶ .............................................. G11C 13/00
[52] U.S. Cl. ........................... 365/230.01; 365/189.01
[58] Field of Search ................. 365/189.01, 189.02, 365/189.03, 189.04, 189.05, 230.01, 230.03

[56] References Cited

U.S. PATENT DOCUMENTS

| | | | |
|---|---|---|---|
| 4,584,674 | 4/1986 | Watanabe | 365/230.06 |
| 4,596,000 | 6/1986 | Wiedmann | 365/174 |
| 4,845,678 | 7/1989 | Van Berkel et al. | 365/230.06 |
| 4,868,788 | 9/1989 | Jinbo | 365/189.06 |
| 4,954,994 | 9/1990 | Hashimoto | 365/230.06 |
| 5,140,553 | 8/1992 | Choi et al. | 365/218 |
| 5,282,175 | 1/1994 | Fujita et al. | 365/230.06 |
| 5,289,429 | 2/1994 | Watanabe | 365/230.06 |
| 5,293,340 | 3/1994 | Fujita | 365/201 |
| 5,297,105 | 3/1994 | Matsui et al. | 365/230.06 |

FOREIGN PATENT DOCUMENTS 60-197955 10/1985 Japan .
63-177392 7/1988 Japan .

Primary Examiner—Terrell W. Fears
Attorney, Agent, or Firm—Edward D. Manzo

[57] ABSTRACT

A selection circuit of the present invention comprises a plurality of word lines each of which is coupled to a plurality of memory cells, the word lines including first and second groups of word lines, a first decode line group having a plurality of first decode lines each of which is coupled to the first group of the word lines, a second decode line group having a plurality of second decode lines each of which is coupled to the second group of the word lines, a plurality of address input terminals applied to an address signal, a first input terminal applied to a first signal, a second input terminal applied to a second signal, a first selecting switch coupled to the first and second decode line groups and the address input terminals for selecting one of the decode lines in response to the address signal, a second selecting switch coupled to the first decode line group and the first input terminal for selecting the first decode lines in response to the first signal and a third selecting switch coupled to the second decode line group and the second input terminal for selecting the second decode lines in response to the second signal.

5 Claims, 17 Drawing Sheets

NMOS TRANSISTOR         SYMBOL OF THE
                        NMOS TRANSISTOR

PMOS TRANSISTOR         SYMBOL OF THE
                        PMOS TRANSISTOR

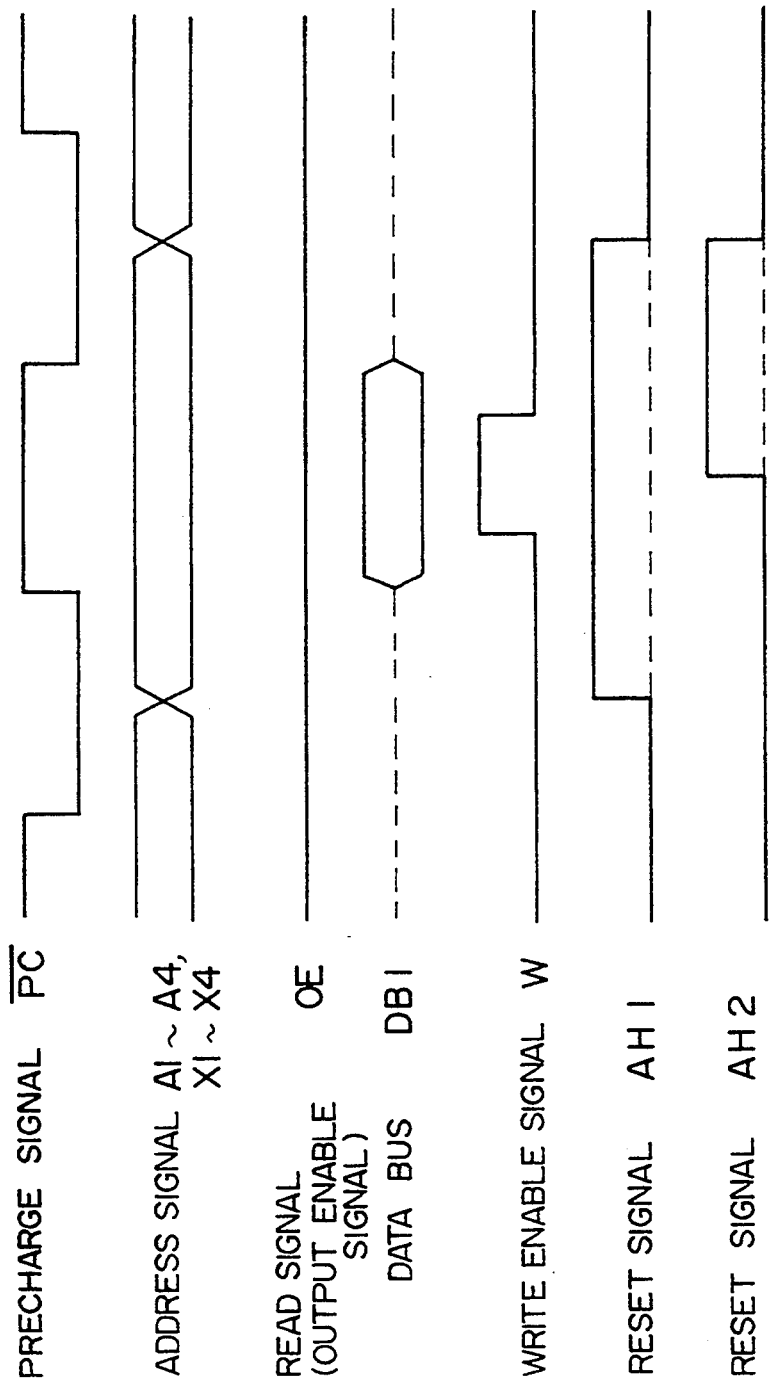

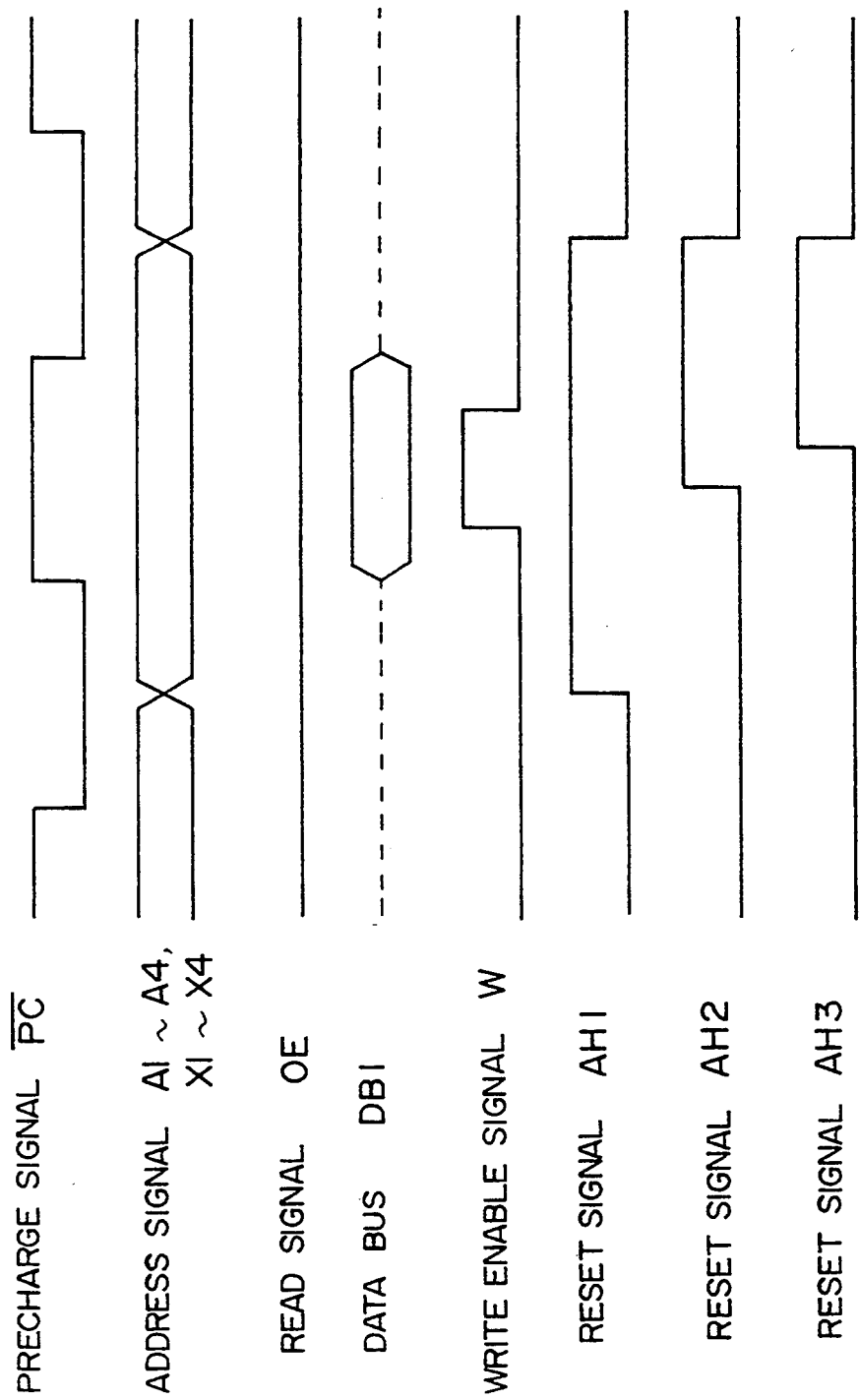

| FIG.12A | FIG.12B |

WORD LINE SELECTION CIRCUIT FOR SELECTING MEMORY CELLS

CROSS REFERENCE TO RELATED APPLICATION

This application is a divisional of U.S. application Ser. No. 08/086,008, filed on July 1, 1993 now abandoned.

This application claims the priority of Japanese Patent Application Serial No. 4-179,879, filed Jul. 7, 1992, the subject matter of which is incorporated herein by reference.

BACKGROUND OF THE INVENTION

The present invention relates to a semiconductor memory such as a Static Random Access Memory (hereinafter referred to as a SRAM), particularly to a semiconductor memory characterized in writing data in a memory cell thereof, i.e. the semiconductor memory having word line selection circuits for selecting memory cells thereof.

The related art of the invention are disclosed in Japanese Laid-Open Publication Nos. 60-197955 and 63-177392 wherein same data can be written in all memory cells at the same time.

SUMMARY OF THE INVENTION

It is an object of the present invention to provide a word line selecting circuit which can write data into memory cells correctly.

It is another object of the present invention to provide a word line selecting circuit which can write data into memory cells at a higher speed.

According to one aspect of the present invention, for achieving the above objects, there is provided a plurality of word lines each of which is coupled to a plurality of memory cells, the word lines including first and second groups of world lines; a first decode line group having a plurality of first decode lines each of which is coupled to the first group of the word lines, a second decode line group having a plurality of second decode lines each of which is coupled to the second group of the word lines, a plurality of address input terminals applied to an address signal, a first input terminal applied to a first signal, a second input terminal applied to a second signal, a first selecting switch coupled to the first and second decode line groups and the address input terminals for selecting one of the decode lines in response to the address signal, a second selecting switch coupled to the first decode line group and the first input terminal for selecting the first decode lines in response to the first signal, and a third selecting switch coupled to the second decode line group and the second input terminal for selecting the second decode lines in response to the second signal.

BRIEF DESCRIPTION OF THE DRAWINGS

FIG. 7 is a view showing the operation of the first embodiment of the invention;

FIG. 9 is a view showing the operation of the second embodiment of the invention;

DETAILED DESCRIPTION OF THE PREFERRED EMBODIMENTS

A first embodiment of the invention will be described with reference to FIGS. 1 and 2 wherein the invention is applied to an SRAM.

Figure 3:
FIG. 3 is a view showing the symbol of NMOS transistor.
Figure 4:
FIG. 4 is a view showing the symbol of PMOS transistor.

To simplify the explanation, some of NMOS transistors use a symbol as illustrated in FIG. 3. Likewise, some of PMOS transistors use a symbol as illustrated in FIG. 4.

Figure 1:
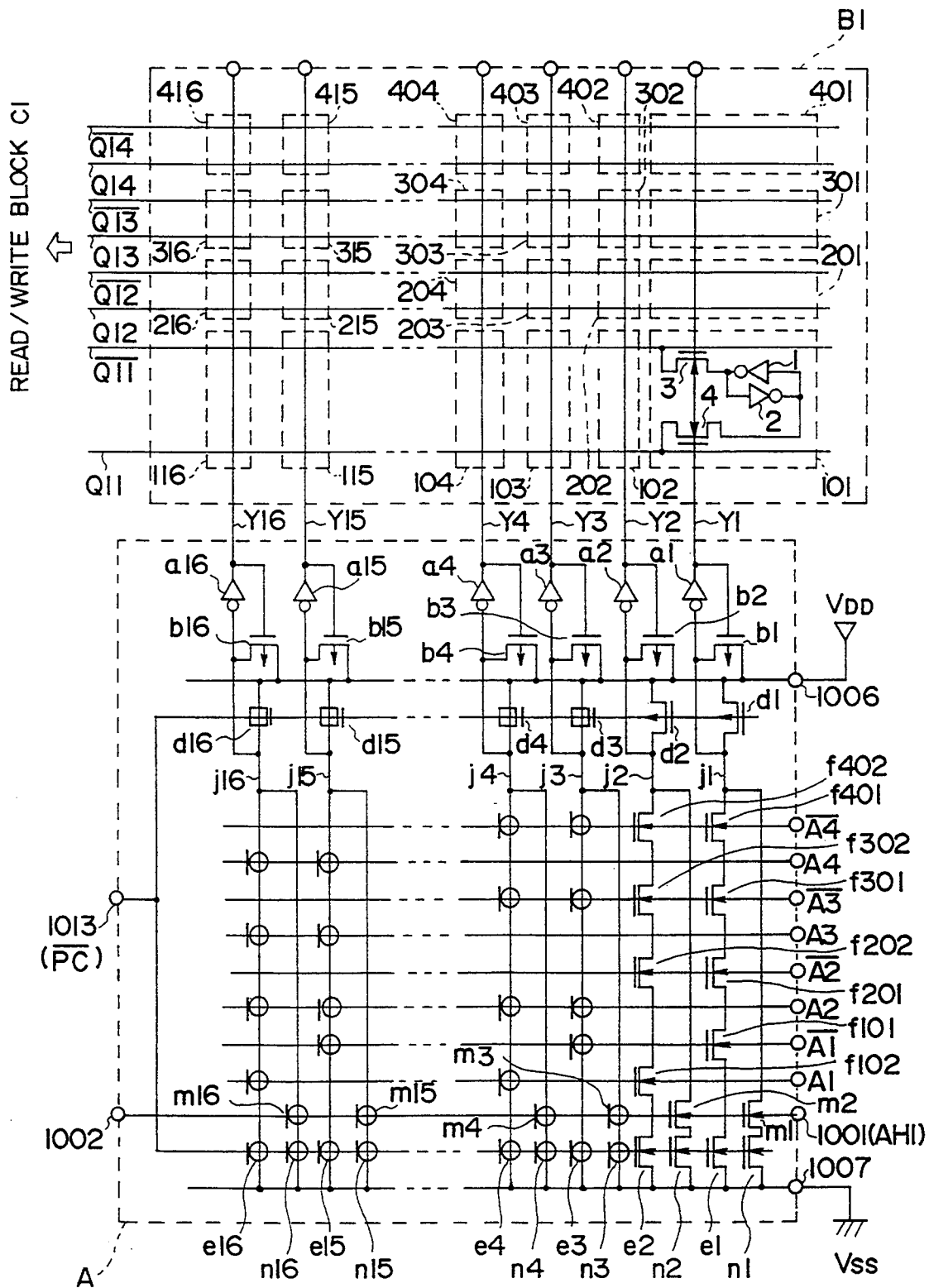
FIG. 1 is a circuit diagram of a first embodiment of the invention.
Figure 2:
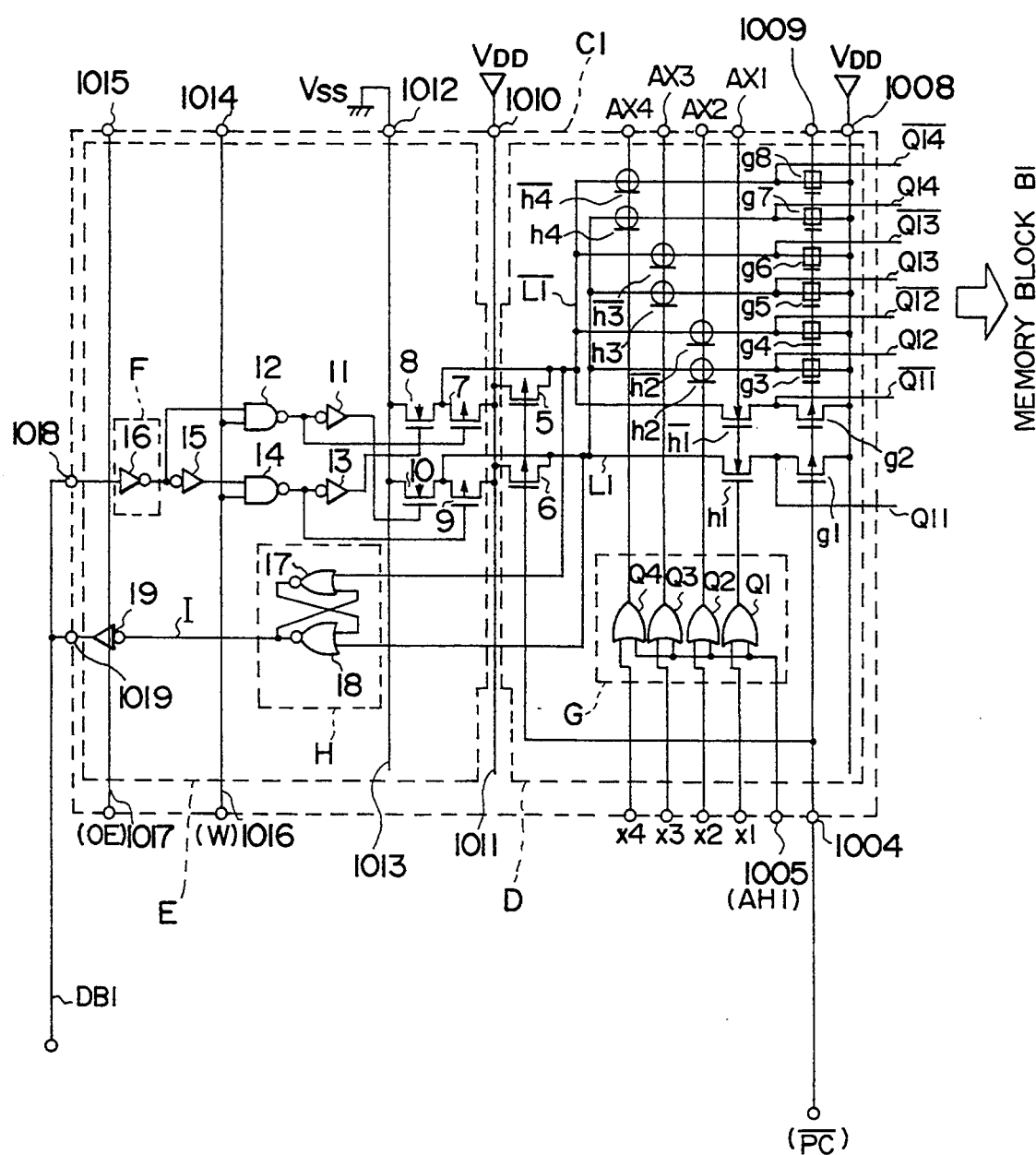
FIG. 2 is a circuit diagram of a first embodiment of the invention.

The SRAM is represented by combination of the circuit diagrams of FIG. 1 and 2 which are connected to each other by way of bit lines Q11–Q14 and $\overline{Q11}$–$\overline{Q14}$ and comprises an address block A, a memory block B1 and a read/write block C1. Furthermore, the read/write block C1 comprises a data selection block D, a data block E, a gate circuit F, a reset control block G and a flip-flop circuit H.

The memory block B1 comprises 64 memory cells which are arranged in an array having four rows and 16 columns, the four rows being connected to four word lines and the 16 columns being connected to 16 bit lines.

A memory cell 101 comprises a latch circuit composed of inverters 1 and 2 and NMOS transistors 3 and 4 which are respectively connected to a word line Y1 at the gates thereof. The drain of the NMOS transistor 3 is connected to the bit line $\overline{Q11}$ and the drain of the NMOS transistor 4 is connected to the bit line Q11. Since other memory cells in the memory block B1, i.e., the memory cells 102–116, 201–216, 301–316 and 401–416 have respectively the same arrangements as the memory cell 101, the explanations thereof are omitted.

The address block A is a circuit for selecting word lines in response to address signals.

Figure 5A:
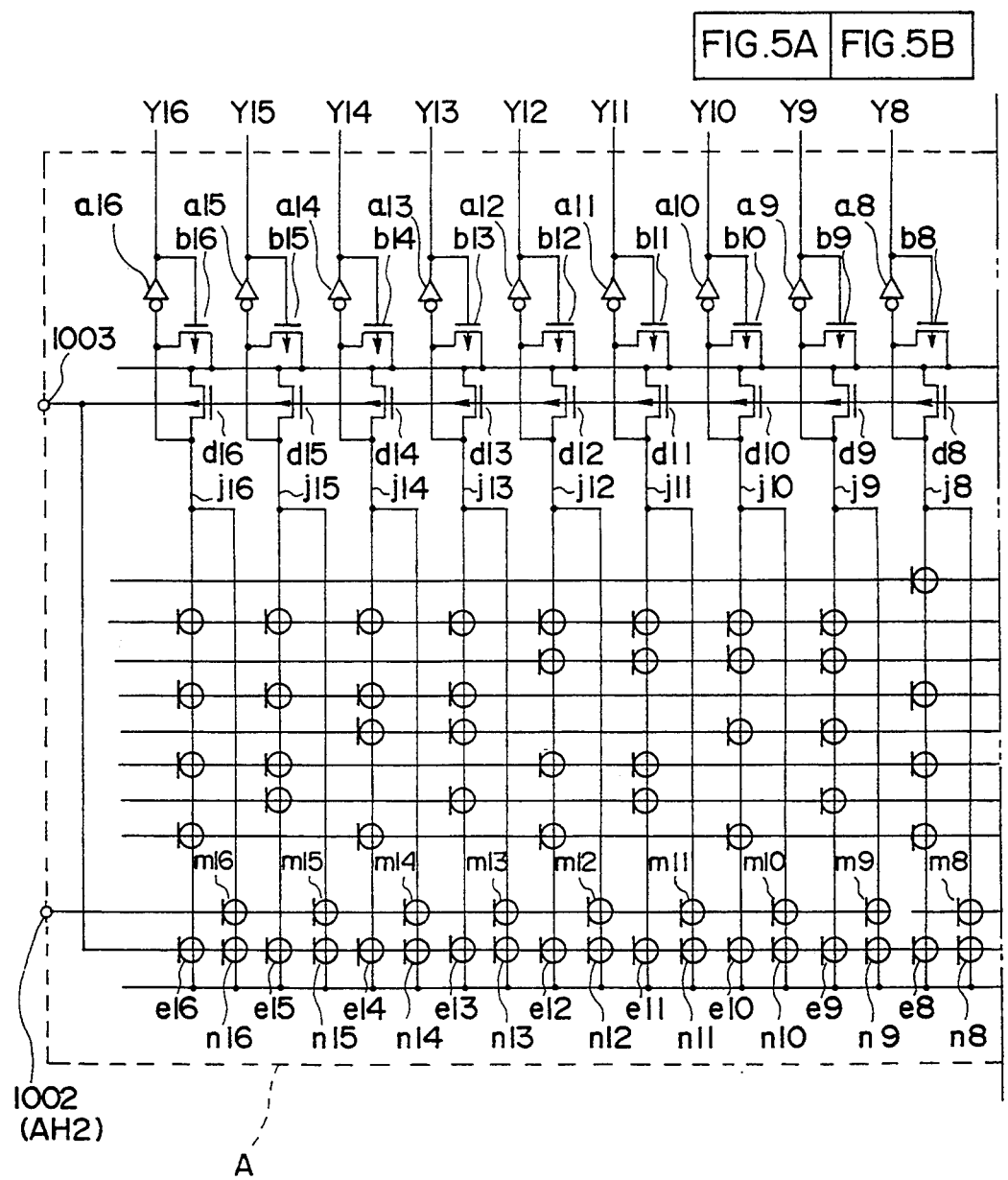
FIG. 5 composed of FIGS. 5A and 5B is a circuit diagram an address block according to the first embodiment of the invention.
Figure 5B:
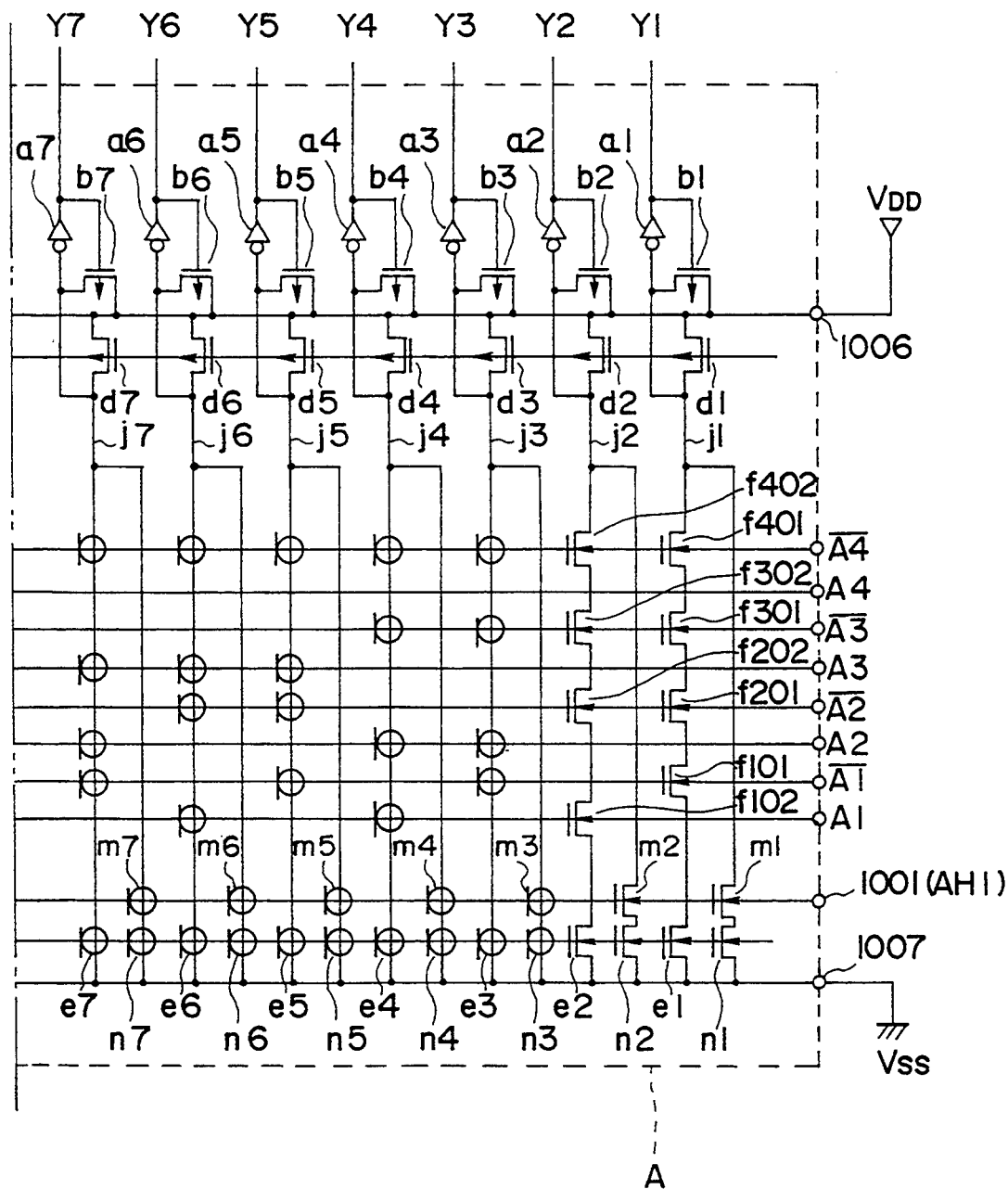

The address block A will be described more in detail with reference to FIG. 5 which enlarges the address block A of FIG. 1.

The address block A includes a $V_{DD}$ terminal 1006 to which a power supply potential $V_{DD}$ is applied, a $V_{SS}$ terminal 1007 to which a ground potential $V_{SS}$ is applied, a pre-charge terminal 1003 to which a pre-charge signal is supplied, address terminals A1–A4 and $\overline{A1}$–$\overline{A4}$ to which address signals A1–A4 and $\overline{A1}$–$\overline{A4}$ are supplied and reset terminals 1001 and 1002 to which reset signals AH1 and AH2 are supplied. The sources of NMOS transistors e1–e16 are respectively connected to the $V_{SS}$ terminal 1007 and the gates thereof are respectively connected to the pre-charge terminal 1003. NMOS transistor f101, f201, f301 and f401 are connected to one another in series in this order between the drain of an NMOS transistor e1 and a decode line J1 and also connected to address terminals $\overline{A1}$–$\overline{A4}$ at the gates thereof. NMOS transistors f102, f202, f302 and f402 are connected to one another in series in this order between the drain of an NMOS transistor e2 and a decode line J2 and also connected to address terminals $\overline{A1}$–$\overline{A4}$ at the gates thereof. Likewise, there are four NMOS transistors connected in series between the drains of NMOS transistors e3–e16 and decode lines J3–J16. The gates of these four NMOS transistors are connected to either of the address terminals A1–A4 and $\overline{A1}$–$\overline{A4}$.

With the arrangement of the address block A, one of the 16 decode lines J1–J16 is selected by the address signals A1–A4 and $\overline{A1}$–$\overline{A4}$. The selected decode line is changed to an L-level (hereinafter referred to as goes LOW) when the pre-charge signal is at H-level (hereinafter referred to as HIGH). That is, when one of the decode lines is selected, four NMOS transistors connected in series to the decode lines are all turned on. At least one of four NMOS transistors, connected in series to non-selected decode lines, is turned off. Accordingly, the non-selected decode lines are HIGH.

A method of selecting the decode lines will be described hereinafter. Suppose that the relation between the address signals and the levels thereof is set as (A4, A3, A2, A1)=(0,0,0,0), the expression (A4, A3, A2, A1)=(1,1,1,1) is established. Accordingly, four NMOS transistors f101, F201, F301 and f401 which are connected in series to the decode line J1 are all turned on. As a result, the decode line J1 alone is selected. Likewise, a given decode line can be selected by suitably setting the address signals.

The sources of NMOS transistors n1–n16 are connected to the $V_{SS}$ terminal 1007 while the gates thereof are connected to the pre-charge terminal 1003. NMOS transistors m1–m8 are connected respectively between the decode line J1–J8 and the NMOS transistors n1–n8. The gates of the NMOS transistors m1–m8 are commonly connected to the reset terminal 1001 and the sources thereof are respectively connected to the drains of the NMOS transistors n1–n8 while the drains thereof are respectively connected to the decode lines J1–J8.

NMOS transistors m9–m16 are respectively connected between the decode lines J9–J16 and NMOS transistors n9–n16. The gates of the NMOS transistor m9–m16 are commonly connected to the reset terminal 1002 and the sources thereof are respectively connected to the drains of the NMOS transistors n9–n16 while the drains thereof are respectively connected to the decode lines J9–J16. PMOS transistors d1–d16 are respectively connected to the decode lines J1–J16. The gates of the PMOS transistors d1–d16 are commonly connected to the pre-charge terminal 1003 and the sources thereof are connected to the $V_{DD}$ terminal 1006 while the drains thereof are respectively connected to the decode lines J1–J16 and also to the drains of PMOS transistors b1–b16.

The PMOS transistor b1–b16 are connected between the $V_{DD}$ terminal and the decode lines J1–J16. The gates of the PMOS transistors b1–b16 are respectively connected to word lines Y1–Y16. Inverters a1–a16 are respectively connected between the drains and the gates of the PMOS transistors b1–b16.

Returning to FIG. 2, the read/write block C1 will be described hereinafter.

A reset control block G in the read/write block C comprises four two-input OR gates Q1–Q4. One input terminals of the OR gates Q1–Q4 are connected to address terminals X1–X4 to which address signals X1–X4 are supplied and other input terminals thereof are commonly connected to the reset terminal 1005 to which a reset signal AH1 is supplied. Outputs of the OR gates Q1–Q4 are supplied to address terminals AX1–AX4 as address signals AX1–AX4. These address signals AX1–AX4 are used as address signals in other read/write blocks C2–C8, which will be described more in detail later.

The data selection block D includes PMOS transistors g1–g8, NMOS transistors h1–h4 and $\overline{h1}$–$\overline{h4}$ and PMOS transistors 5 and 6. The gates of the PMOS transistors g1–g8 are commonly connected to the pre-charge terminal 1004 while the sources thereof are respectively connected to the $V_{DD}$ terminal 1008. The drains of the PMOS transistors g1, g3, g5 and g7 are connected to the bit lines Q11, Q12, Q13 and Q14. The drains of the PMOS transistors g2, g4, g6 and g8 are connected to bit lines $\overline{Q11}$, $\overline{Q12}$, $\overline{Q13}$ and $\overline{Q14}$. A pre-charge signal $\overline{PC}$ which is supplied to the pre-charge terminal 1004 is supplied to other data selection blocks C2–C8 by way of the pre-charge terminal 1009.

The gates of the NMOS transistors h1–h4 are connected to the output terminals of the OR gates Q1–Q4 while the sources thereof are commonly connected to the data line L1 and the drains thereof are connected to the bit lines Q11, Q12, Q13 and Q14.

The gates of the NMOS transistors $\overline{h1}$–$\overline{h4}$ are connected to the output terminals of the OR gates Q1–Q4 while the sources thereof are commonly connected to the data line L1 and the drains thereof are connected to the bit lines $\overline{Q11}$, $\overline{Q12}$, $\overline{Q13}$ and $\overline{Q14}$.

The PMOS transistor 5 is connected between the data line $\overline{L1}$ and a $V_{DD}$ line 1011. The gate of the PMOS transistor 5 is connected to a pre-charge terminal 1004 while the source thereof is connected to a $V_{DD}$ line 1011 and the drain thereof is connected to the data line $\overline{L1}$. The PMOS transistor 6 is connected between the data line L1 and the $V_{DD}$ line 1011. The gate of the PMOS transistor 6 is connected to the pre-charge terminal 1004 while the source thereof is connected to the $V_{DD}$ line 1011 and the drain thereof is connected to the data line L1. A $V_{DD}$ level is applied to the $V_{DD}$ line 1011 by way of a $V_{DD}$ terminal 1010 by an external device.

The data block E includes the gate circuit F and the flip-flop circuit H. The flip-flop circuit H comprises two two-input NOR gates 17 and 18. The NOR gate 17 is connected to the data line $\overline{L1}$ at one input terminal thereof and to an output terminal of the NOR gate 18 at the other input terminal thereof. The NOR gate 18 is connected to an output terminal of the NOR gate 17 at one input terminal thereof and to the data line L1 at the other input terminal thereof.

The gate circuit F comprises an inverter 16. The gate circuit F inverts a signal which is supplied to a data write terminal 1018 which is connected to a data bus DB1.

The data block E includes inverters 11, 13 and 15, a three-state buffer 19, two-input NAND gates 12 and 14, NMOS transistors 8 and 10 and PMOS transistors 7 and 9. The sources of the NMOS transistors 8 and 10 are commonly connected to a $V_{SS}$ line 1013 while the gates thereof are connected to output terminals of the inverters 13 and 11 and the drains thereof are connected to the data lines $\overline{L1}$ and L1. A $V_{SS}$ level is applied to the $V_{SS}$ line 1013 by way of a $V_{SS}$ terminal 1012.

The sources of the PMOS transistors 7 and 9 are commonly connected to the $V_{DD}$ line 1011 while the gates thereof are connected to output terminals of the NAND the gates 12 and 14 and the drains thereof are connected to the data lines $\overline{L1}$ and L1.

The NAND gate 12 is connected to a write enable signal line 1016 at one input terminal thereof and to an output terminal of the inverter 16 at the other input terminal thereof while an output terminal of the NAND gate 12 is connected to an input terminal of the inverter 11.

The NAND gate 14 is connected to the write enable signal line 1016 at one input terminal thereof and to an output terminal of the inverter 15 at the other output terminal thereof while an output terminal of the NAND gate 14 is connected to an input terminal of the inverter 13. A write enable signal $\overline{W}$ is supplied to the write enable signal line 1016 and also supplied to the other read/write blocks C2–C8 by way of the write enable terminal 1014.

The three-state buffer 19 is connected between an output terminal (output terminal of the NOR gate 18) of the flip-flop circuit H and a data read terminal 1019 and is controlled by the output enable signal which is supplied to the output enable signal line 1017.

Figure 6:
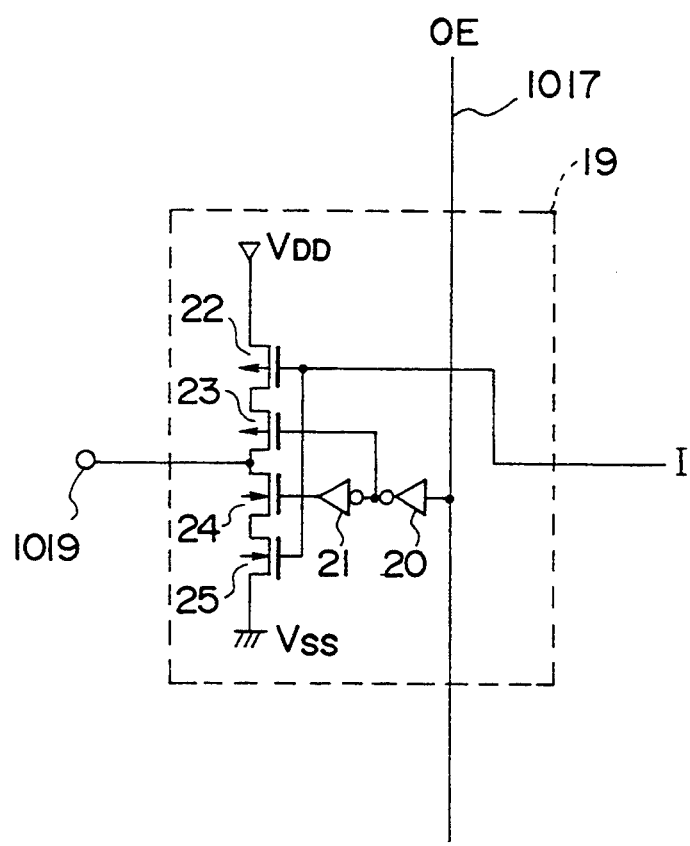
FIG. 6 is a detailed circuit diagram of a three-state inverter.

FIG. 6 is a detailed circuit diagram of the three-state buffer 19. The three-state buffer 19 comprises two inverters 20 and 21, NMOS transistors 24 and 25 and PMOS transistors 22 and 23. The three-state buffer 19 permits the data read terminal 1019 to be at high impedance state irrespective of the level of an input signal I (output signal of the flip-flop circuit H) since the PMOS transistor 23 and the NMOS transistor 24 are respectively turned off when the output enable signal line 1017 keeps LOW. Accordingly, the level of the input signal I is not transmitted to the data bus DB1. When the output enable signal line 1017 is LOW, the PMOS transistor 23 and the NMOS transistor 24 are respectively turned on so that the three-state buffer 19 serves as an inverter. That is, the level of the input signal I is inverted and supplied to the data read terminal 1019 which transmits this level to the data bus DE1. The output enable signal which is supplied to an output enable terminal OE is supplied to the other read/write blocks C2–C8 by way of an output enable terminal 1015.

The operation of the SRAM of the invention will be described with reference to waveforms of FIG. 7.

Write Operation

Described first is the operation when the reset signals AH1 and AH2 are HIGH.

When the pre-charge signal $\overline{PC}$ is LOW (pre-charge time), the PMOS transistors d1–d16 are respectively turned on while the NMOS transistors n1–n16 and the NMOS transistors e1–e16 are respectively turned off. Accordingly, the $V_{DD}$ level of the $V_{DD}$ terminal 1006 is applied to the decode lines J1–J16 by way of the PMOS transistors d1–d16 whereby the decode lines are charged (pre-charged) at the $V_{DD}$ level (H level). At this state, the decode lines J1–J16 go HIGH irrespective of the logical values of the address signals A1–A4 and $\overline{A1}$–$\overline{A4}$. The $V_{DD}$ levels (H levels) of the decode lines J1–J16 are inverted by the inverters a1–a16 so that all the word lines Y1–Y16 go LOW. When the word lines Y1–Y16 go LOW, the NMOS of the memory cells 101–416 are all turned off so that each memory cell is electrically disconnected from the bit lines Q11–Q14 and $\overline{Q11}$–$\overline{Q14}$. That is, it is impossible to write data in or read the data from the memory cells. When the word lines Y1–Y16 go LOW, the PMOS transistors b1–b16 are turned on so that the $V_{DD}$ level which is applied to the $V_{DD}$ terminal 1006 is applied to the decode lines J1–J16 by way of the PMOS transistors b1–b16. That is, the word lines are held LOW by the PMOS transistors b1–b16 and the inverters a1–a16.

When the pre-charge signal PC is LOW, the PMOS transistors g8 are respectively turned on. Accordingly, the $V_{DD}$ level which is applied to the $V_{DD}$ terminal 1008 is applied to the bit lines Q11–Q14 and $\overline{Q11}$–$\overline{Q14}$ by way of the PMOS transistors g1–g8. That is, the bit lines Q11–Q14 and $\overline{Q11}$–$\overline{Q14}$ are all pre-charged at the $V_{DD}$ level. At this state, the bit lines Q11–Q14 and $\overline{Q11}$–$\overline{Q14}$ go HIGH irrespective of the logical values of the address signals X1–X4.

When the pre-charge signal PC is LOW, the address signals A1–A4 and $\overline{A1}$–$\overline{A4}$ (hereinafter referred to as first address signals) for selecting the word lines and address signals X1–X4 (hereinafter referred to as second address signals) for selecting bit lines are respectively suitably set for thereby preparing to select one of the memory cells. As described above, however, it is impossible to select the memory cells during the pre-charge.

Moreover, during the pre-charge, both of the outputs of the NAND gates 12 and 14 of the data selection block E go HIGH since the write enable signal $\overline{W}$ which is applied to the write enable signal line 1016 is LOW. Accordingly, both of the PMOS transistors 7 and 9 which are connected to the $V_{DD}$ line 1011 are turned off. Likewise, both of the NMOS transistors 8 and 10 which are connected to the $V_{SS}$ line 1013 are turned off. As a result, data on the data bus DB1 are not transmitted to the memory cells when the write enable signal $\overline{W}$ is LOW.

When the pre-charge signal $\overline{PC}$ goes HIGH, the PMOS transistors d1–d16 are turned off, the NMOS transistors e1–e16 are turned on and the pre-charged state of the decode lines J1–J16 is canceled, so that only one of the decode lines is selected by the previously set first address signal. That is, the electric charge ($V_{DD}$ level) of the selected decode line is discharged by way of one of the NMOS transistors e1–e16. For example, when (A4, A3, A2, A1)=(0, 0, 0, 0) is established regarding to the first address signal, the NMOS transistors f101, f201, F301 and f401 are turned on and the decode line J1 goes LOW. When the decode line J1 goes LOW, the output of the inverter a1 goes HIGH. Accordingly, only the word line Y1 goes HIGH while the word lines Y2–Y16 are held LOW. At that time, the PMOS transistor b1 is turned off so that the pre-charged state of the decode line is canceled. When the word line Y1 goes HIGH, all NMOS transistors (FIG. 1 shows the NMOS transistors 3 and 4 representing the memory cell 101) of the memory cells 101, 201, 301 and 401 which are connected to the word line Y1 are turned on, so that each memory cell is connected to the bit lines corresponding thereto.

When the pre-charge signal $\overline{PC}$ goes HIGH, the PMOS transistors g1–g8 are turned off, so that the pre-charged state of the bit lines Q11–Q14 and $\overline{Q11}$–$\overline{Q14}$ is canceled.

Since the reset signals AH1 and AH2 are LOW, the second address signals X1–X4 become the outputs of the OR gates Q1–Q4. Then a bit line is selected by the previously set second address signal. For example, when (X1, X2, X3 and X4)=(1, 0, 0, 0) is established regarding to the second address signal, the NMOS transistors h1 and $\overline{h1}$ are turned on. As a result, the bit lines Q11 and $\overline{Q11}$ are electrically connected to the bit lines L1 and $\overline{L1}$.

As described above, when the pre-charge signal $\overline{PC}$ goes HIGH, a given memory cell is selected by the first and second address signals which were previously set when the pre-charge signal $\overline{PC}$ was LOW. Since (A1, A2, A3 and A4)=(0, 0, 0, 0) regarding to the first address signal and (X1, X2, X3, X4)=(1, 0, 0, 0) regarding to the second address signal are established, only the memory cell 101 is selected. That is, the memory cell 101 (Strictly speaking, the latch circuit composed of the inverters 1 and 2 in the memory cell 101) is electrically connected to the bit lines Q11 and $\overline{Q11}$.

When the write enable signal W goes HIGH while the pre-charge signal $\overline{PC}$ is HIGH, one input terminal of the NAND gate 12 and one input terminal of the NAND gate 14 in the data block E go HIGH. Accordingly the levels which are applied to the other input terminals of the NAND gates 12 and 14 are respectively transmitted to the output terminals of the NAND gates 12 and 14. Suppose that the data bus DB1 is set logical "1" (HIGH level) just before the write enable signal W rises as illustrated in FIG. 7. The HIGH level applied to the data write terminal 1018 is inverted by the inverter 16 and is applied to the other input terminal of the NAND gate 12. And the output of the inverter 16 is further inverted by the inverter 15 and is applied to the other input terminal of the NAND gate 14. Accordingly, the output of the NAND gate 12 remains HIGH, and the PMOS transistor 7 and the NMOS transistor 10 remain OFF. On the other hand, since the output of the NAND gate 14 is changed to LOW, the PMOS transistor 9 and the NMOS transistor 8 are turned on. As a result, the $V_{DD}$ (HIGH) level is applied to the data line L1 by way of the PMOS transistor 9. At the same time, the $V_{SS}$ (LOW) level is applied to the data line $\overline{L1}$ by way of the NMOS transistor 8. Since the data line L1 is electrically connected to the bit line Q11 while the data line $\overline{L1}$ is electrically connected to the bit line $\overline{Q11}$, the bit line Q11 goes HIGH while the bit line $\overline{Q11}$ goes LOW. These levels of the bit lines Q11 and $\overline{Q11}$ are transmitted to the memory cell 101. Accordingly, data 1 is written in the latch circuit composed of the inverters 1 and 2 by way of the NMOS transistors 3 and 4.

If the logical value of the data bus DB1 is logical "0", the bit line Q11 is LOW and the bit line $\overline{Q11}$ is HIGH. As a result, logical data "0" is written in the latch circuit composed of the inverters 1 and 2 by way of the NMOS transistors 3 and 4.

Thereafter, when the write enable signal W goes LOW, the NAND gate 12 and 14 inhibits receiving data from the data bus DB1. Accordingly, the memory cell 101 keeps the written data intact. Subsequently, when the pre-charge signal $\overline{PC}$ goes LOW, the pre-charge operation is resumed. As described above, the period between the start of the pre-charge operation and that of next pre-charge operation called one write cycle. Data are written during the one write cycle.

The operation of the SRAM when the reset signals AH1 and AH2 are applied thereto during the write operation will be described hereinafter with reference to FIG. 7.

When the pre-charge signal $\overline{PC}$ is LOW, HIGH level is applied to the reset terminals 1001 and 1005. That is, the reset signal AH1 is set HIGH. Then, the NMOS transistors m1–m8 of the address block A are turned on. (The time when the reset signal AH1 is set HIGH may be before the write enable signal W is set HIGH.)

When the reset signal AH1 is set HIGH, the output of the OR gates Q1–Q4 in the reset control block G goes HIGH irrespective of the second address signal. As a result, all the NMOS transistors h1–h4 and h1–$\overline{h1}$ are turned on, so that all the bit lines are electrically connected to the data lines corresponding thereto.

When the pre-charge signal $\overline{PC}$ goes HIGH, the NMOS transistors n1–n16 and e1–e16 are turned on. As a result, the potential of the decode lines J1–J8 goes LOW irrespective of the first address signal. (But the first address signal is supposed not to select the decode lines J9–J16.) When the potential of the decode lines J1–J8 goes LOW, the word lines Y1–Y8 go HIGH. When the word lines Y1–Y8 go HIGH, 32 memory cells connected to the word lines Y1–Y8 are selected. When the write enable signal W is set HIGH at this state, data on the data bus DB1 are written in the 32 memory cells in the operation similar to the write operation set forth above. (a first write operation)

Subsequently, the reset terminal 1002 is set HIGH. That is, when the reset signal AH2 is set HIGH, the NMOS transistors m9–m16 are turned on. As a result, the decode lines J9–J16 go LOW irrespective of the first address signal. When the decode lines J9–J16 go LOW, the word lines Y9–Y16 go HIGH and 32 memory cells connected to the word lines Y9–Y16 are selected. Since the write enable signal W is HIGH at this time, data on the data bus DB1 are written in the 32 memory cells. (a second write operation)

As described above, data on the data bus DB1 are written in 64 memory cells in two write operations in one write cycle.

Suppose that the first address signal is set to select one of the decode lines J9–J16 when the reset signal AH1 is set HIGH, four memory cells which correspond to the selected decode line are selected together with 32 memory cells which correspond to the decode lines J1–J8.

That is, data are written in 36 memory cells in the first write operation and data are written in 28 memory cells in the second write operation.

Writing data are written in two write operations in one write cycle as set forth above has the following merits.

For example, when the logical value of the data bus DB1 is logical "1", the $V_{DD}$ level applied to the $V_{DD}$ line 1011 raises the bit lines Q11–Q14 to the $V_{DD}$ level, while the $V_{SS}$ level applied to the $V_{SS}$ line 1013 lowers the bit lines $\overline{Q11}$ and $\overline{Q11}$ to the $V_{SS}$ level. Accordingly, the NMOS transistor 8 and the PMOS transistor 9 need to have an enough ability to re-write memory cells in one write operation corresponding to the number thereof. For example, in case of writing data in 64 memory cells in one write operation, the dimensions $W_n$ and $W_p$ of the NMOS transistor 8 and the PMOS transistor 9 need to be 400 μm respectively. According to the first embodiment of the present invention, however, it is enough that the NMOS transistor 8 and the PMOS transistor 9 have an ability of writing data in 36 memory cells at maximum in one write operation. Accordingly, it is enough that the NMOS transistor 8 and the PMOS transistor 9 have the following dimensions:

$$W_n, W_p = 400 \times \frac{36}{64} = 225 \ \mu m$$

It is the same with regard to the NMOS transistor 10 and the PMOS transistor 7.

As described above, it is possible to remarkably reduce the chip size of the SRAM by reducing the dimensions of the MOS transistors.

Moreover, it is possible to reduce the electric currents in the $V_{DD}$ line 1011 and the $V_{SS}$ line 1013 since the number of memory cells in which data are written in-one write cycle is small. As a result, it is possible to reduce a voltage drop due to the resistance of the $V_{DD}$ line 1011 and the $V_{SS}$ line 1013, and consequently it is possible to correctly transmit the externally applied $V_{DD}$ (5V) and the $V_{SS}$ (0V) terminals to the memory cells. (read operation)

In a read operation, the write enable signal W for the write operation is set LOW, while a read signal (output enable signal) OE is set HIGH instead of the write enable signal W. The logical value of a memory cell selected by the first and second address signals is transmitted to the data lines L1 and $\overline{L1}$. Successively, the flip-flop circuit H applies a level corresponding that of the data lines L1 and $\overline{L1}$ to the three-state buffer 19. If the data line L1 is HIGH and the data line $\overline{L1}$ is LOW (the memory cell keeps logical "1"), the flip-flop circuit H produces LOW level. In this state, since the read signal OE is HIGH, the LOW level supplied to the three-state buffer 19 is inverted to be applied to the data read terminal 1019. As a result, the data bus DB1 goes HIGH. In this way, data 1 stored in the memory cell is read out to the data bus DB1.

Figure 8A:
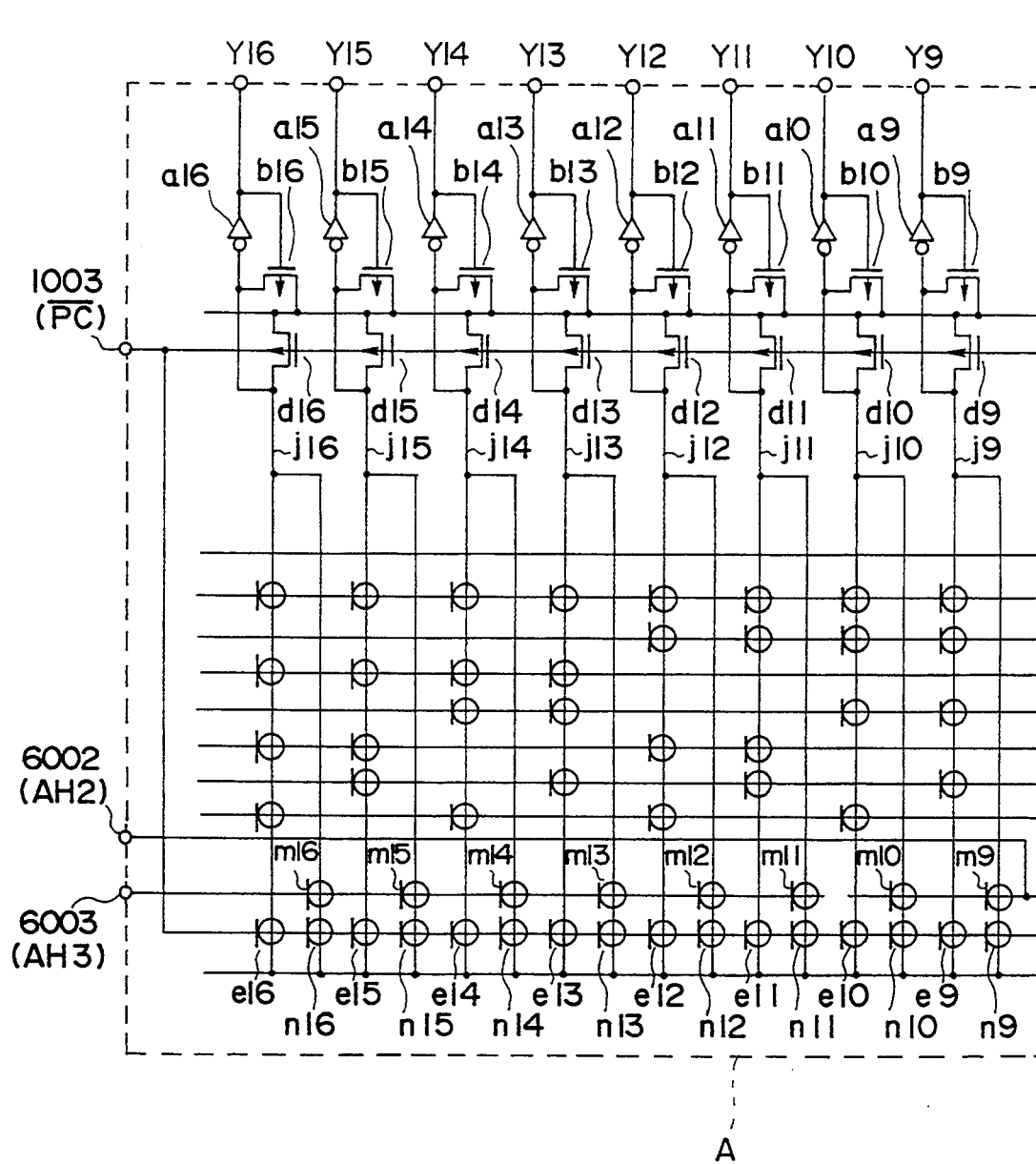
FIG. 8 composed of FIGS. 8A and 8B is a circuit diagram of an address block according to the second embodiment of the invention.
Figure 8B:
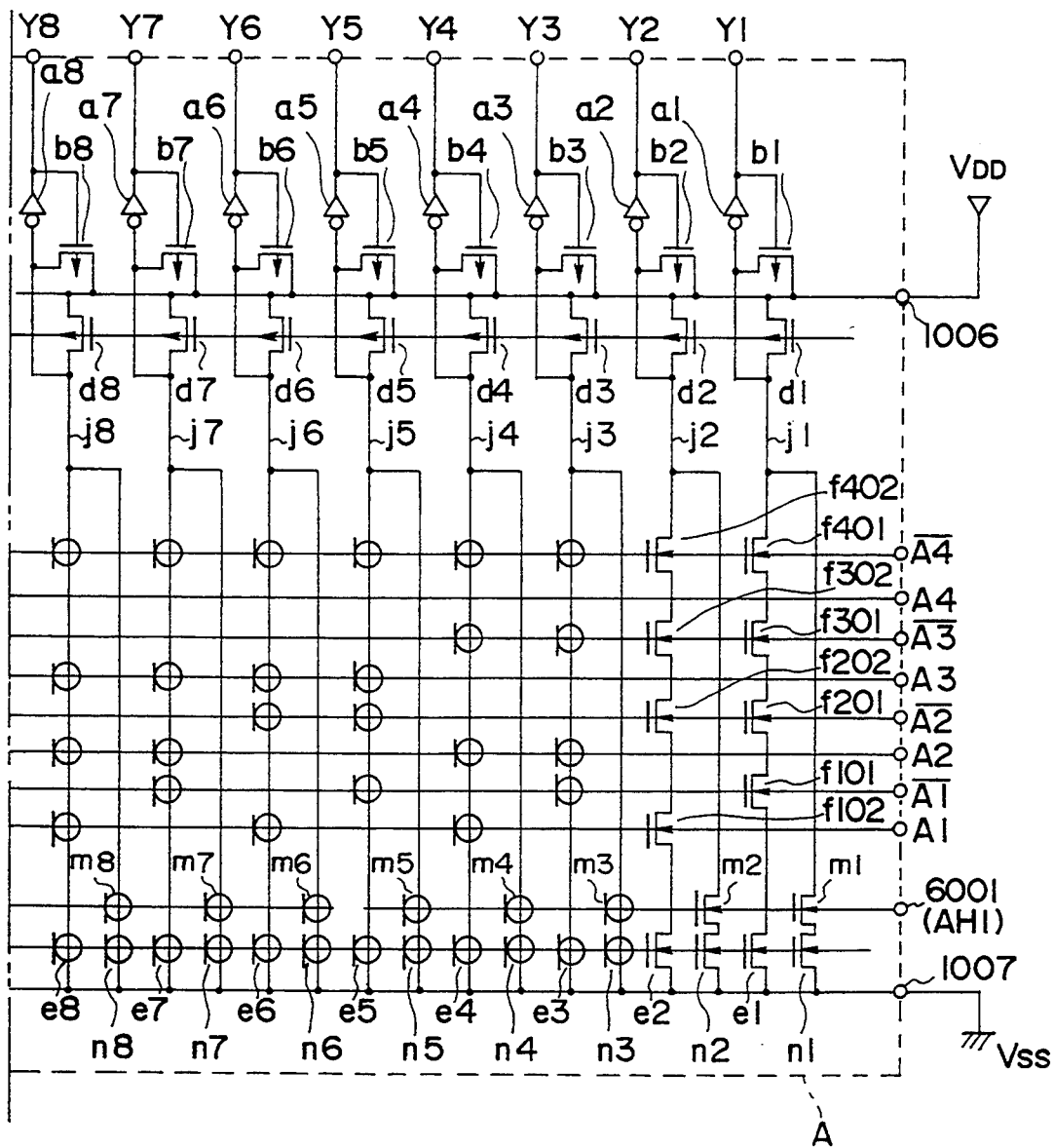

A second embodiment of the present invention will be described hereinafter with reference to FIG. 8. The difference between the first and the second embodiments resides in the arrangement of the address block A. The address block A according to the second embodiment comprises reset terminals 6001, 6002 and 6003, to which NMOS transistors m1–m5, m6–m10 and m11–m16 are connected respectively. Other components are the same as the first embodiment.

The operation of the second embodiment will be described hereinafter with reference to FIG. 9. Data are written in the memory cells in one write cycle divided into three. At first, a reset signal AH1 is applied to the reset terminal 6001, when the decode lines J1–J5 go LOW irrespective of the first address signal. When the decode lines J1–J5 go LOW, the word lines Y1–Y5 go HIGH, so that 20 memory cells which correspond to the word lines Y1–Y5 are selected and data supplied by the read/write block C1 are written in the 20 memory cells. Successively, a reset signal AH2 is applied to the reset terminal 6002, when 20 memory cells which correspond to the word lines Y6–Y10 are newly selected and data supplied by the read/write block C1 are written in the 20 memory cells. Finally, a reset signal AH3 is applied to the reset terminal 6003, when 24 memory cells which correspond to the word lines Y11–Y16 are newly selected and data supplied by the read/write block C1 are written in the 24 memory cells. If the first address signal is set to select one of the decode lines J6–J10 when the reset signal AH1 is set HIGH, four memory cells which correspond to the selected decode line are selected together with the 20 memory cells. As a result, data are written in 24 memory cells in the first write operation, in 16 memory cells in the second write operation and in 24 memory cells in the third write operation.

As described above, since data are written in the memory cells in three write operations in one write cycle, it is enough that the NMOS transistors 8 and 10 and the PMOS transistors 7 and 9 have the following dimensions:

$$W_n, W_p = 400 \times \frac{24}{64} = 150 \ \mu m$$

As a result, the transistors can be smaller than those in the first embodiment in chip size, so that the HIGH and LOW levels can be transmitted to the memory cells more correctly.

It is also possible to further reduce the number of the memory cells by providing additional reset terminals according to the present invention.

Figure 10A:
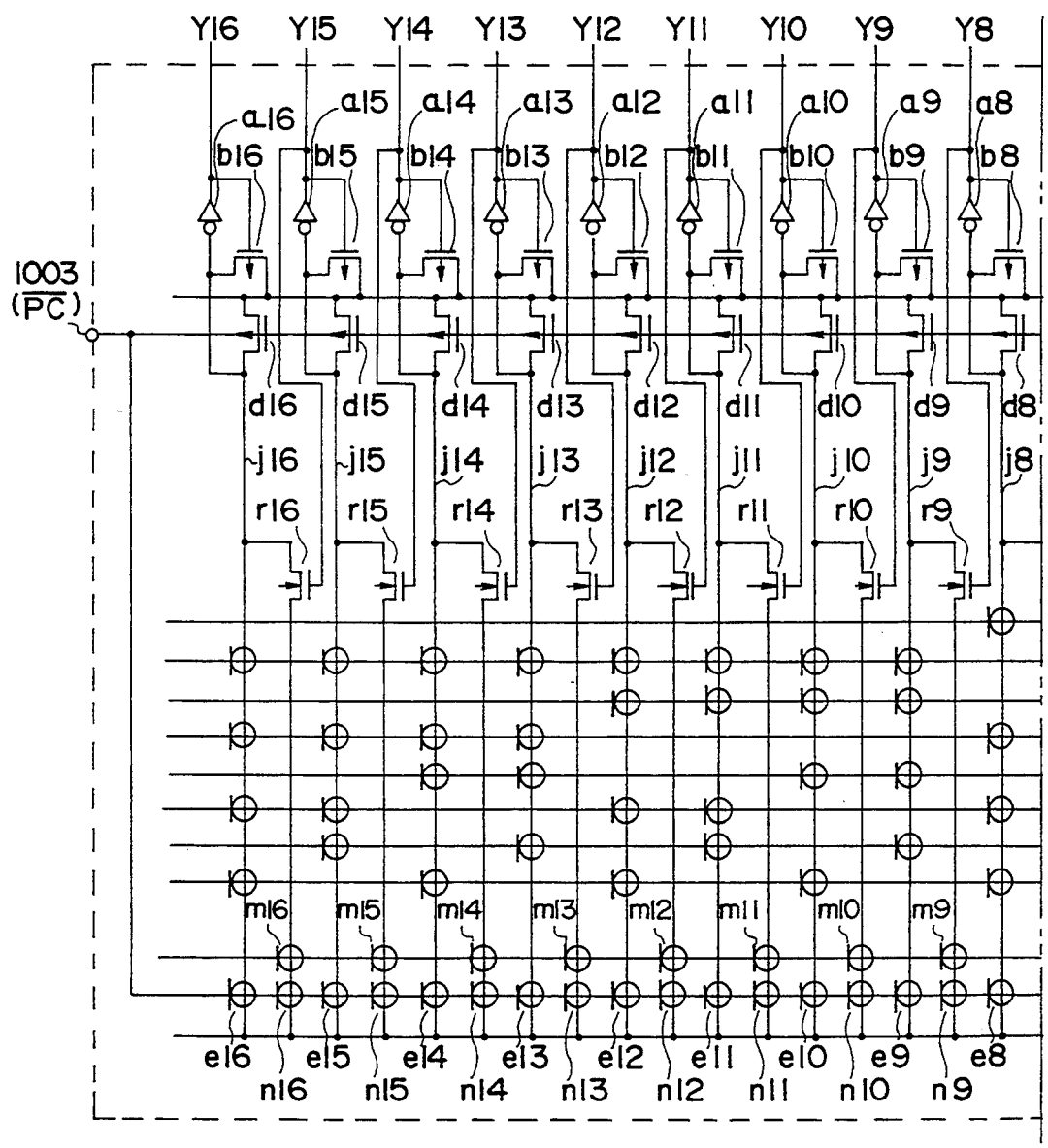
FIG. 10 composed of FIGS. 10A and 10B is a circuit diagram of an address block according to the third embodiment of the invention.
Figure 10B:
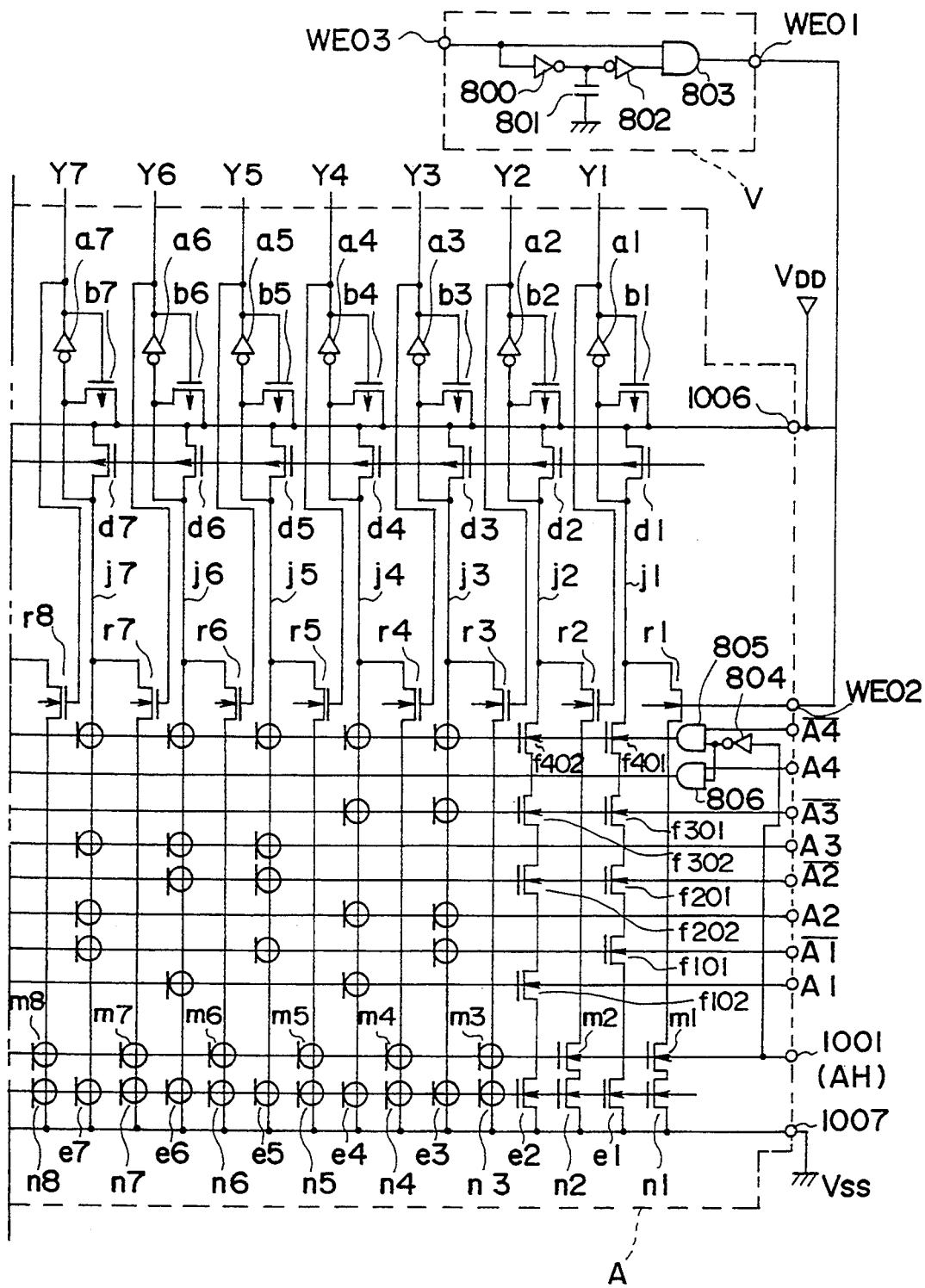

A third embodiment of the present invention will be described hereinafter with reference to FIG. 10. Other arrangements other than the address block A are the same as those of the first and second embodiments.

According to the third embodiment, NMOS transistors r1–r16 are connected between the decode lines J1–J16 and the drains of the NMOS transistors m1–m16. The gates of the NMOS transistors r2–r16 are respectively connected to the preceding decode lines. A write enable signal delay circuit V is connected to the gate of the NMOS transistor r1 by way of a write enable terminal WE02. The write enable signal delay circuit V comprises inverters 800 and 802, a capacitor 801, an AND gate 803 and write enable terminals WE03 and WE01. The address block A further includes an inverter 804 and AND gates 805 and 806. An reset terminal 1001 to which an reset signal AH is applied is commonly connected to the gates of the NMOS transistors m1–m16.

Figure 11:
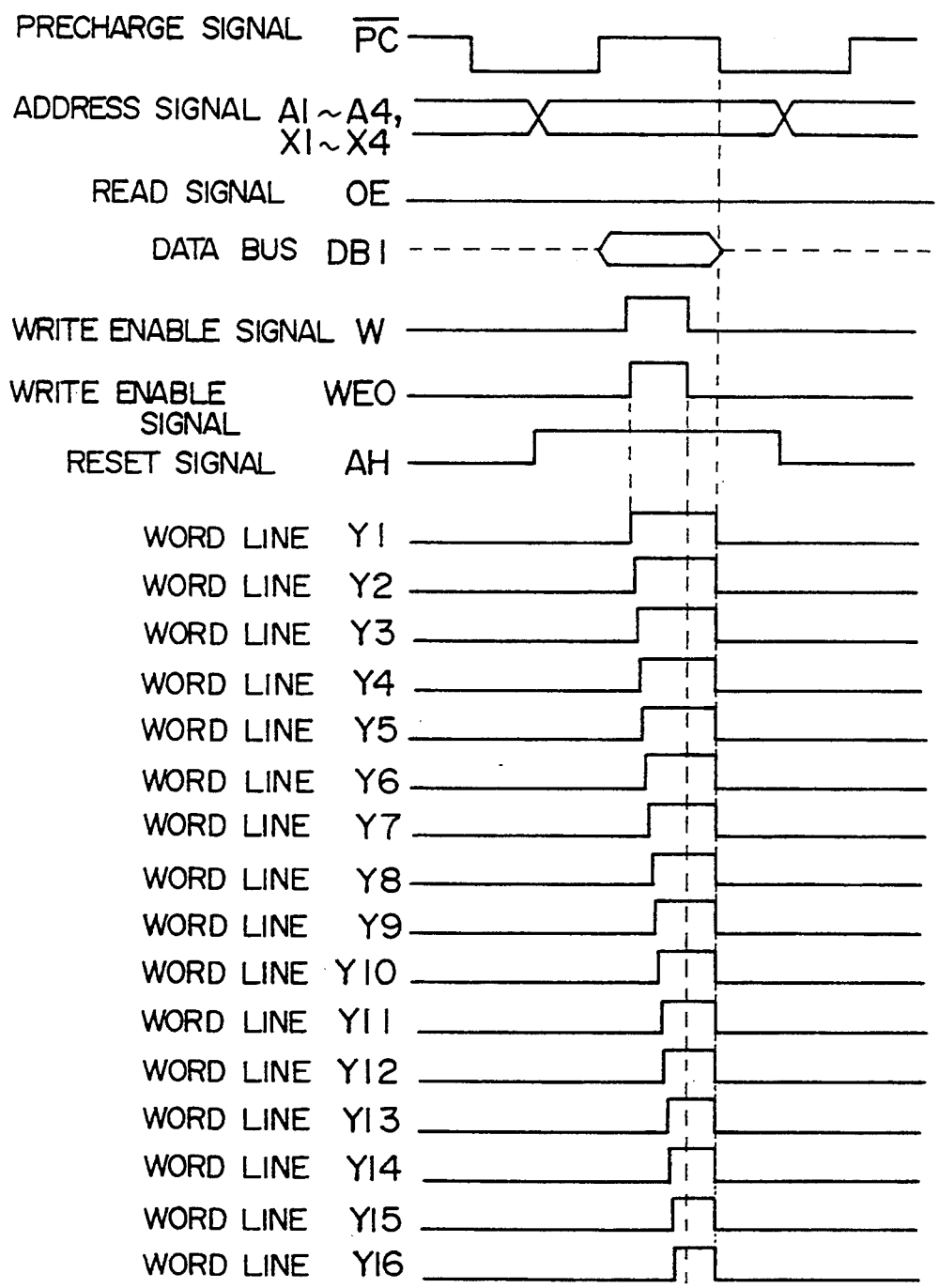
FIG. 11 is a view showing the operation of the third embodiment of the invention.

The operation of the third embodiment will be described hereinafter with reference to FIG. 11.

When the reset signal AH is set HIGH while the pre-charge signal $\overline{PC}$ is LOW, all the NMOS transistors m1–m16 are turned on. When the reset signal AH goes HIGH, the AND gates 805 and 806 become in the inhibit state and output LOW level respectively. As a result, eight NMOS transistors including the NMOS transistors f401 and f402 which are connected to the AND gate 805 and eight NMOS transistors which are connected to the AND gate 806 are turned off, so that the first address signals become all invalid. Successively the pre-charge signal $\overline{PC}$ goes HIGH to cancel the pre-charged state. Then the write enable signal W is set HIGH. The HIGH level write enable signal W is delayed for a given time by the write enable signal delay circuit V so as to be applied to the NMOS transistor r1. When the delayed write enable signal W is applied to the NMOS transistor r1, the NMOS transistor r1 is turned on so that the decode line J1 goes LOW. When the decode line J1 goes LOW, the word line Y1 goes HIGH, so that four memory cells which correspond to the word line Y1 are selected and data supplied by the read/write block C1 are written in the four memory cells. When the decode line J2 goes LOW, the word line Y2 goes HIGH, so that four memory cells which correspond to the word line Y2 are selected and data supplied by the read/write block C1 are written in the four memory cells.

The word lines go HIGH successively one by one from higher to lower lines repeating the above operation, wherein it takes about 10 ns after the word line Y1 goes HIGH until writing data in the memory cells which correspond to the word line Y1 according to the third embodiment. Then it takes about 4 ns until the lower word line Y2 goes HIGH. That is, two lower word lines go HIGH in 10 ns at maximum. As a result, since the number of memory cells in which data can be written simultaneously is 12 at maximum, it is enough that the NMOS transistors 8 and 10 and the PMOS transistors 7 and 9 have the following dimensions:

$$W_n, W_p = 400 \times \frac{12}{64} = 75 \ \mu m$$

As a result, the transistors can be smaller than those in the second embodiment in chip size, so that the HIGH and LOW levels can be transmitted to the memory cells more correctly.

Moreover, the write enable signal W is deliberately delayed so as to correctly write data in the memory cells according to the third embodiment. It takes about 10 ns after the write enable signal W goes HIGH until the levels of the bit lines are determined according to the third embodiment. Accordingly, a write enable signal WEO is generated by delaying the write enable signal W by the write enable signal delay circuit V for about 15 ns and is applied to the NMOS transistor r1. As a result, the levels (data) of the bit lines are already determined when the memory cells which correspond to the word line Y1 are selected. If the levels of the bit lines are not determined when the word line Y1 is selected, data may be written in the memory cells twice. For example, if the bit line is HIGH when logical "0" is to be written in a memory cell, the HIGH level is temporarily written in the memory cell and successively LOW level is written therein. Accordingly, it is the reason why the write enable signal W is deliberately delayed.

Figures 12, 12A:
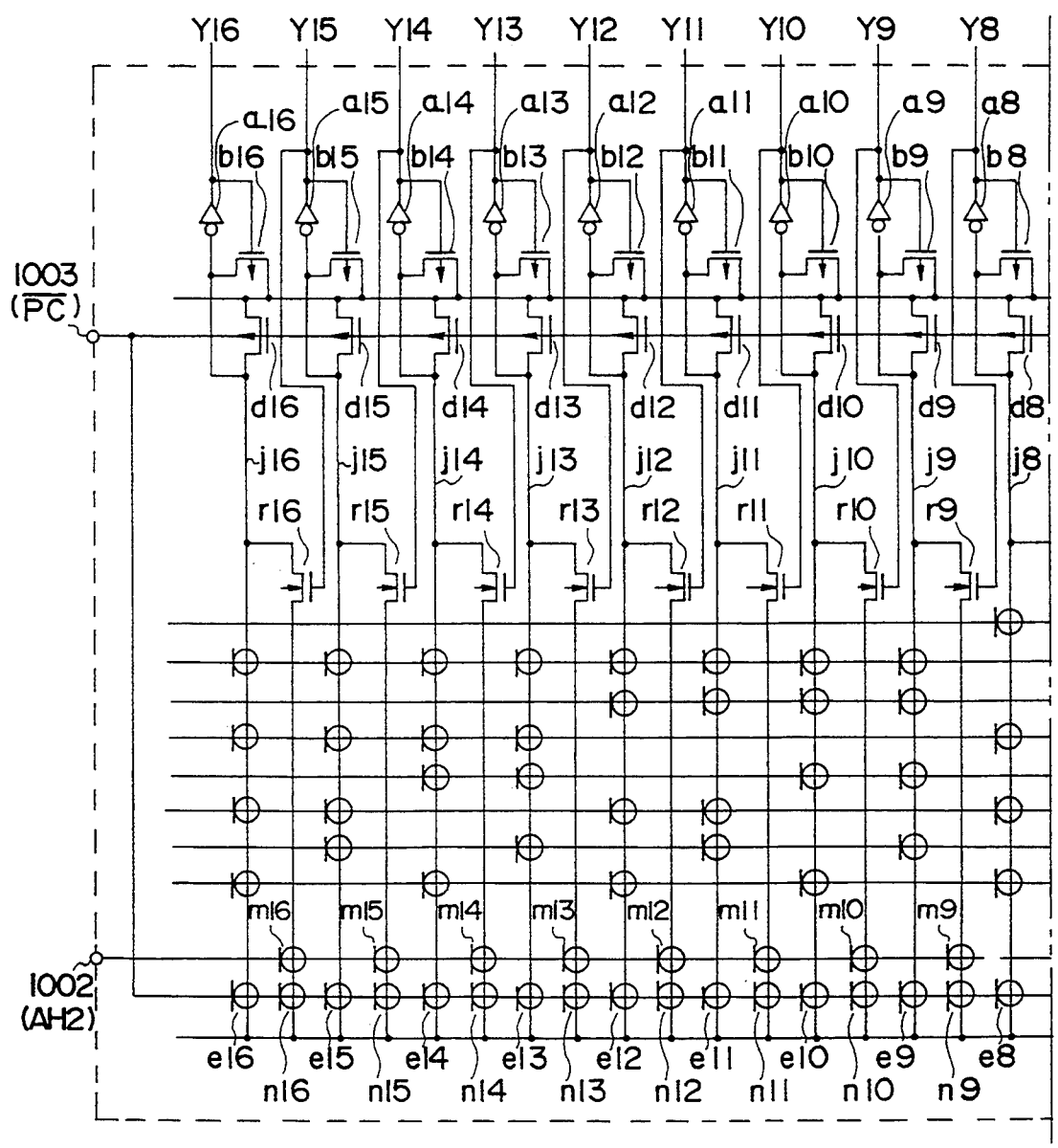
FIG. 12 composed of FIGS. 12A and 12B is a circuit diagram of an address block according to the fourth embodiment of the invention.
Figure 12B:
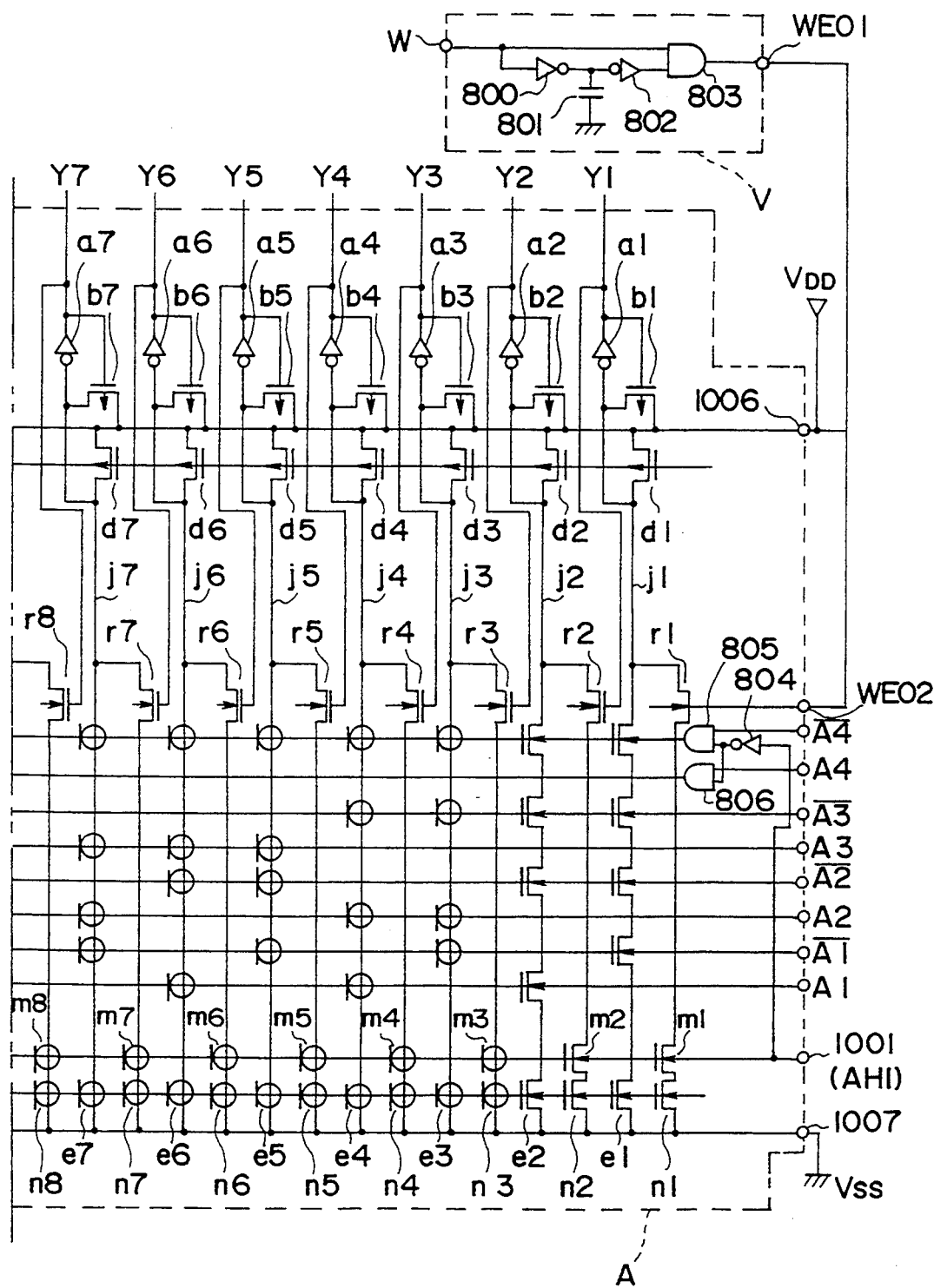

FIG. 12 shows a fourth embodiment of the present invention which is a combination of the third and the first embodiments thereof, wherein the write enable signal delay circuit V of the third embodiment is added to the address block A of the first embodiment. The explanation of the operation of the fourth embodiment is omitted since the difference between the fourth and first embodiments in operation is only delaying the write enable signal W.

Figure 13:
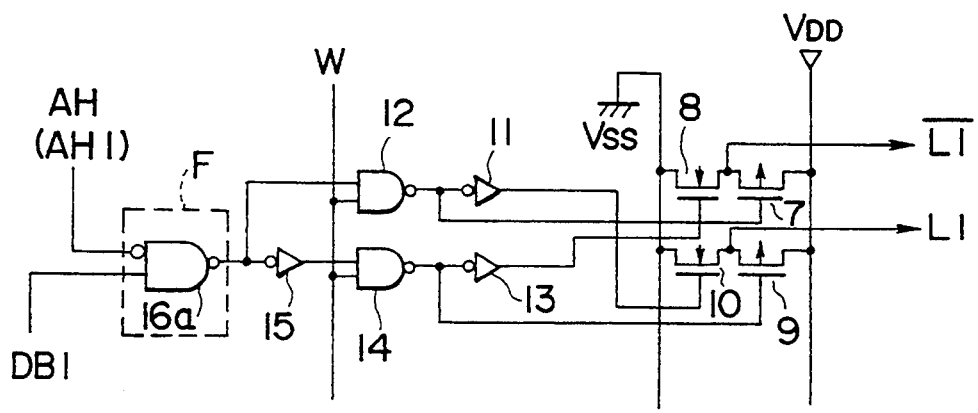
FIG. 13 is a view explaining a modified example of a gate circuit F.

A modified gate circuit F will be described hereinafter with reference to FIGS. 13 and 14. A gate circuit 16a which is illustrated in FIG. 13 sets the data line L1 LOW and the data line $\overline{L1}$ HIGH irrespective of the data of the data bus DB1 when the reset signal AH (AH1) is HIGH (supposing that the write enable signal W is set HIGH). That is, the gate circuit F illustrated in FIG. 13 enables to write logical "0" in all the memory cells. On the other hand, when the reset signal AH (AH1) is LOW, the level of the bit lines is determined by the level of the data bus DB1.

Figure 14:
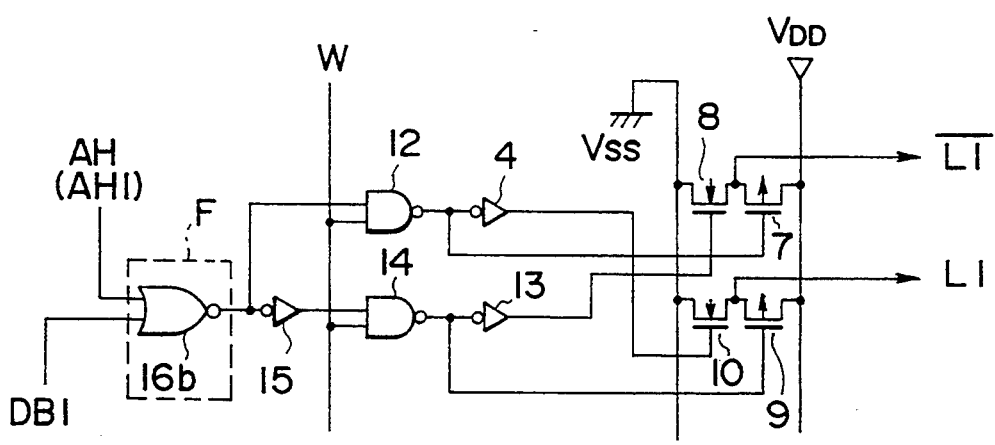
FIG. 14 is a view explaining another modified example of the gate circuit F.

A gate circuit 16b illustrated in FIG. 14 sets the data line L1 HIGH and the data line $\overline{L1}$ LOW irrespective of the data of the data bus DB1 when the reset signal AH (AH1) is HIGH (supposing that the write enable signal W is set HIGH). That is, the gate circuit F illustrated in FIG. 14 enables to write logical "1" in all the memory cells.

The gate circuit F illustrated in FIGS. 13 and 14 can be applied commonly to the first to fourth embodiments. If the gate circuit F illustrated in FIGS. 13 and 14 is employed, data can be written in all the memory cells by the reset signal AH (AH1) alone without newly setting data in the data bus DB1. That is, the SRAM can be easily initialized.

Figure 15:
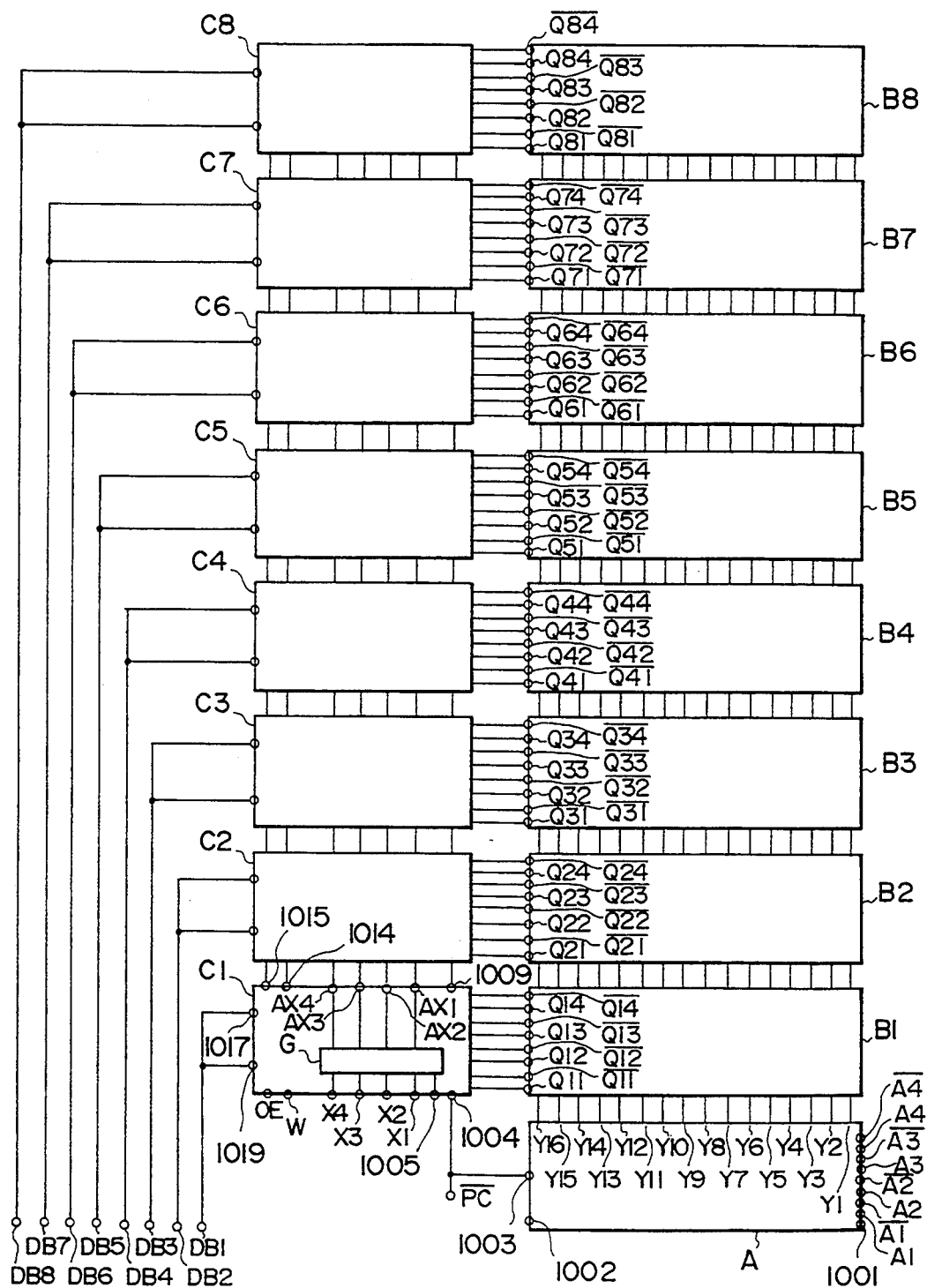
FIG. 15 is a circuit diagram of an SRAM having a 64 word structure.

The SRAM as described in the first to fourth embodiments is used, for example, in an arrangement of 64 words (8=64=512 bits) as illustrated in FIG. 15. In FIG. 15, the address block A, the memory block B1 and the read/write block C1 are the same as set forth above. Memory blocks B2–B8 are the same as the memory block B1 in arrangement. The read/write blocks C2–C8 are the same as the read/write block C1 in arrangement. The word lines Y1–Y16 are commonly connected to the memory blocks B1–B8. The memory blocks B1–B8 are respectively connected to the read/write blocks C1–C8 by way of the bit lines Q11–Q84 and $\overline{Q11}$–$\overline{Q84}$. Address terminals AX1–AX4, a pre-charge terminal 1009, a data write terminal 1014 and a data read terminal 1015 are commonly connected to the read/write blocks C2–C8. Moreover, data buses DB2–DB8 are respectively connected to the read/write blocks C2–C8.

The read/write blocks C2–C8, however, do not comprise the reset control block G.

Accordingly, the SRAM having a 64 word structure as illustrated in FIG. 15 can be used, for example, for a display character temporary storage device of a liquid crystal display etc.

What is claimed is:

1. A word line selecting circuit comprising:
   a plurality of word lines each of which is coupled to a plurality of memory cells;
   a plurality of decode lines each of which is coupled to one of said word lines;
   a plurality of address input terminals applied to an address signal;
   a first input terminal applied to a first signal;
   a first selecting switch coupled to said decode lines and said address input terminals for activating one of said decode lines in response to the address signal;
   a second selecting switch coupled to one of the decode lines and said first input terminal for activating the decode line in response to the first signal; and
   a plurality of third selecting switches coupled to each of the decode lines for serially activating the other decode lines in response to the activation of the preceding decode line.

2. A word line selecting circuit according to claim 1, wherein said first selecting switch comprises a plurality of series coupled MOS transistors each of which is coupled between one of said decode lines and a reference potential terminal, for electrically connecting therebetween in response to the address signal applied to the gates of series coupled MOS transistors.

3. A word line selecting circuit according to claim 1, wherein each of said third selecting switches comprises a plurality of MOS transistors each of which is coupled between the respective decode lines, for activating the respective decode line in response to the activation of the preceding decode line.

4. A word line selecting circuit according to claim 1, wherein said second selecting switch comprises a MOS transistor coupled between one of the decode lines and a reference potential terminal, for electrically connecting therebetween in response to the first signal applied to the gate of the MOS transistor.

5. A word line selecting circuit comprising:

a reset terminal to which a reset signal is applied;

a plurality of word lines each of which is coupled to a plurality of memory cells;

a plurality of decode lines each of which is coupled to one of said word lines;

a first reset selecting switch coupled to each of said decode lines and said reset terminal for activating the decode lines in response to said reset signal; and a plurality of second reset selecting switches each of which is coupled to a respective one of said decode lines and each of which activates respective decode lines in response to each preceding said second reset selecting switch.

* * * * *